(12) United States Patent
Ichiki et al.

(10) Patent No.: US 10,804,624 B2
(45) Date of Patent: Oct. 13, 2020

(54) JOINT PORTION OF SUPERCONDUCTING WIRES AND METHOD OF JOINING SUPERCONDUCTING WIRES

(71) Applicant: Hitachi, Ltd., Chiyoda-ku, Tokyo (JP)

(72) Inventors: Yota Ichiki, Tokyo (JP); Kazutaka Okamoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 199 days.

(21) Appl. No.: 16/304,010

(22) PCT Filed: May 12, 2017

(86) PCT No.: PCT/JP2017/018013
§ 371 (c)(1),
(2) Date: Nov. 21, 2018

(87) PCT Pub. No.: WO2017/212869
PCT Pub. Date: Dec. 14, 2017

(65) Prior Publication Data
US 2019/0207331 A1    Jul. 4, 2019

(30) Foreign Application Priority Data

Jun. 8, 2016 (JP) .................................. 2016-113989

(51) Int. Cl.
*H01R 4/68* (2006.01)
*H01R 43/00* (2006.01)
(Continued)

(52) U.S. Cl.
CPC ............... *H01R 4/68* (2013.01); *H01B 12/02* (2013.01); *H01R 43/00* (2013.01); *H01R 43/02* (2013.01); *Y02E 40/641* (2013.01)

(58) Field of Classification Search
CPC .......... H01R 4/68; H01R 43/00; H01R 43/02; H01B 12/02; Y02E 40/641
See application file for complete search history.

(56) References Cited

U.S. PATENT DOCUMENTS

2010/0190649 A1    7/2010  Doll et al.
2010/0216647 A1*   8/2010  Tenbrink .................. C04B 35/65
                                                   505/434
(Continued)

FOREIGN PATENT DOCUMENTS

JP     2012-94413 A        5/2012
WO     WO 2016/031283 A1   3/2016

OTHER PUBLICATIONS

International Search Report (PCT/ISA/210) issued in PCT Application No. PCT/JP2017/018013 dated Aug. 15, 2017 with partial English translation (three (3) pages).
(Continued)

*Primary Examiner* — Paul A Wartalowicz
(74) *Attorney, Agent, or Firm* — Crowell & Moring LLP

(57) ABSTRACT

The present invention provides a joint portion of $MgB_2$ superconducting wires having exceptional energization characteristics and high reliability. The joint portion of the superconducting wires according to the present invention has a space for filling Mg into a portion inside a container or pressurizing member, the portion not being adjacent to an $MgB_2$ sintered body.

9 Claims, 5 Drawing Sheets

FILL B

(51) Int. Cl.
*H01B 12/02* (2006.01)
*H01R 43/02* (2006.01)

(56) References Cited

U.S. PATENT DOCUMENTS

2012/0108435 A1 5/2012 Ichiki et al.
2012/0184446 A1* 7/2012 Drechsler ............... H01R 4/68
                                                                505/220

OTHER PUBLICATIONS

Japanese-language Written Opinion (PCT/ISA/237) issued in PCT Application No. PCT/JP2017/018013 dated Aug. 15, 2017 (four (4) pages).

* cited by examiner

[FIG. 2]
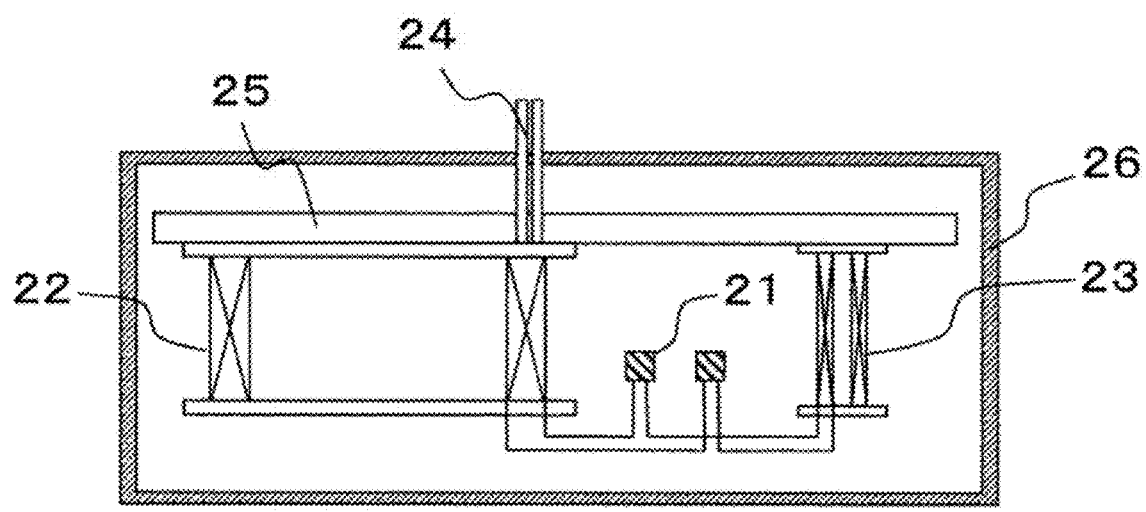

FILL Mg

FILL B

AFTER HEAT TREATMENT

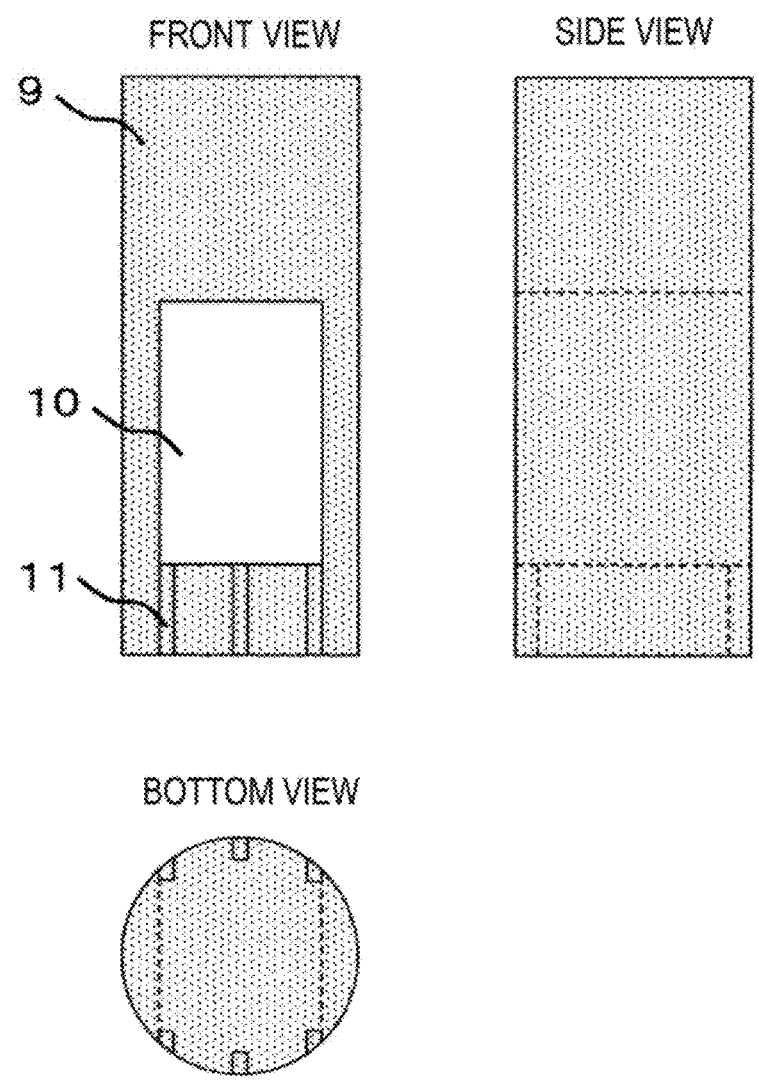

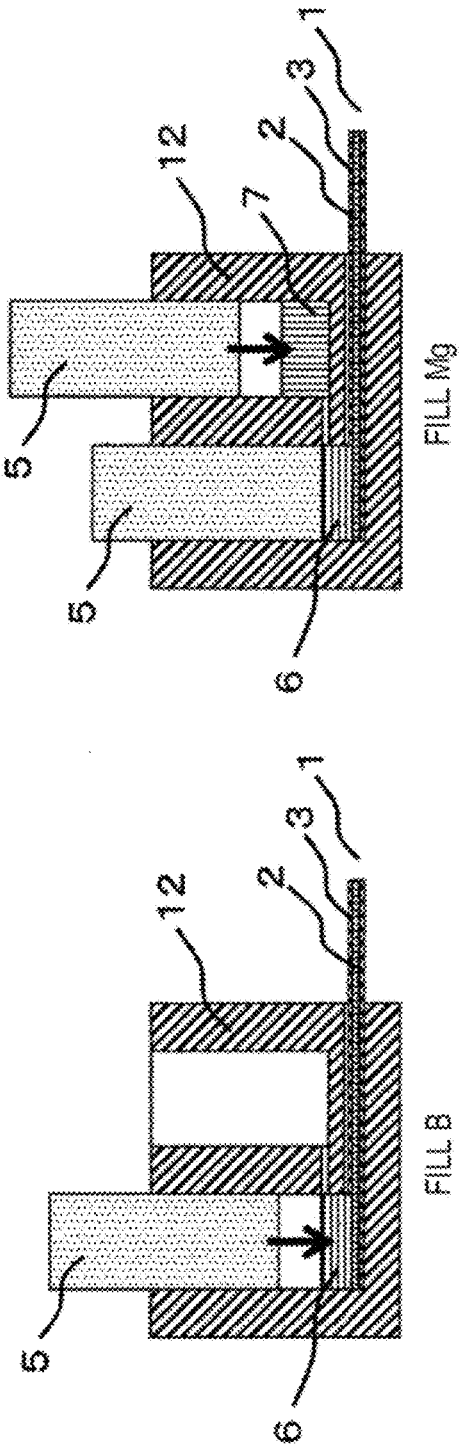
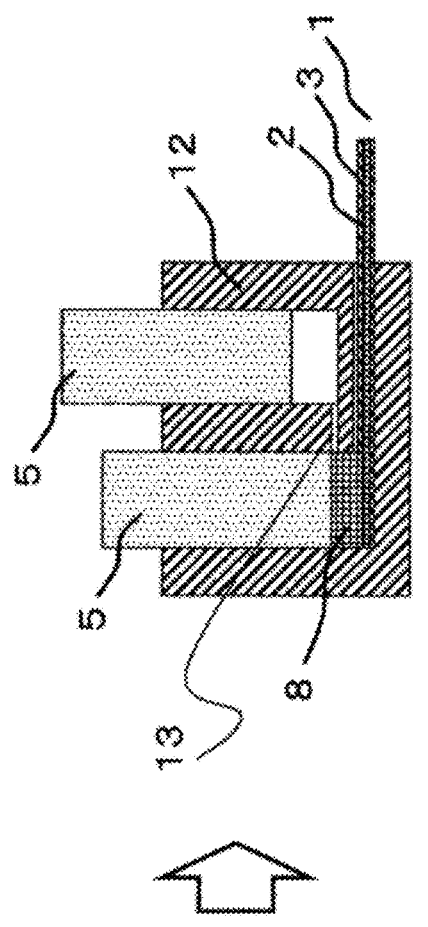

JOINT PORTION OF SUPERCONDUCTING WIRES AND METHOD OF JOINING SUPERCONDUCTING WIRES

TECHNICAL FIELD

The present invention relates to a joining structure of a joint portion of superconducting wires using magnesium diboride ($MgB_2$) and a joining method of $MgB_2$ wire material.

BACKGROUND ART

The critical temperature (transition temperature) of magnesium diboride ($MgB_2$) is 39 K and is higher than the critical temperature of superconductors (for example, niobium titanium (NbTi), Niobium-tin ($Nb_3Sn$), and the like) of the related art. Also, unlike wires using oxide superconductors, wires using $MgB_2$ have the advantage of a magnetic field having high stability when operated in a persistent current mode in a closed circuit using the wires using $MgB_2$.

The persistent current mode is an operation method in which a current continues to flow through a closed circuit formed by using a superconductor. That is, since the resistance of the superconducting wire is zero, once the current flows through the closed circuit, the current continues to flow without attenuation. In order to realize such a persistent current mode, it is important to join the ends of the superconducting wires constructing a superconducting coil or a persistent current switch with superconductors.

In PTL 1, a method of polishing a tip of a wire including a mixed powder of magnesium (Mg) and boron (B) or a $MgB_2$ wire to expose a $MgB_2$ core, inserting the $MgB_2$ core into a container, filling and pressurizing the mixed powder of Mg and B from a direction orthogonal to the wire, and performing heat treatment is disclosed. A sintered body of $MgB_2$ is formed by heat treatment, and the wires are joined to each other.

CITATION LIST

Patent Literature

PTL 1: JP-A-2012-094413

SUMMARY OF INVENTION

Technical Problem

As described in PTL 1, it is important to form a $MgB_2$ sintered body as dense as possible at the end portion of the $MgB_2$ wire in order to manufacture a joint portion having conducting properties. As a method for doing this, a method is described, in which only B powder is filled in the end portion of the wire and Mg powder is filled thereon.

An object of the present invention is to solve the above-mentioned problems relating to joining of $MgB_2$ wires and to realize a joint portion having excellent conducting properties and high reliability.

Solution to Problem

As a result of studies to solve the aforementioned problems, the present inventors have found that the above problems may be solved by the structure of a pressurizing member or a container and completed the present invention. The joint portion of the superconducting wires according to the present invention is characterized in that a space for filling Mg is provided in a portion not adjacent to the $MgB_2$ sintered body (B powder-filled portion before heat treatment).

Advantageous Effects of Invention

According to the present invention, it is possible to solve the above-described problems after the joining process and joining, and to realize a joint portion having excellent conducting properties and high reliability.

BRIEF DESCRIPTION OF DRAWINGS

FIG. 2 is a configuration example of a superconducting magnet.
FIG. 4 is a detailed structure of a pressurizing member 9.
FIG. 5A-5C are joining structures and a process of Example 2.

DESCRIPTION OF EMBODIMENTS

Superconducting magnets are used in a magnetic resonance imaging (MRI) device, a nuclear magnetic resonance (NMR) device, and the like. Since such a device requires a high stability of a magnetic field, the superconducting magnet is operated in a "persistent current mode" in which a closed circuit is constructed only by a superconductor and a current continues to flow. For this purpose, it is essential to connect a superconducting coil, a permanent current switch, and a wiring connecting therebetween via a superconductor.

In the superconducting magnet device of the related art, superconducting wires of NbTi or $Nb_3Sn$ are used, and most of the superconducting wires are cooled with liquid helium and cooled to 4.2 K to be operated. In such a superconducting magnet, a joining technique by superconducting solder typified by PbBi alloy has been established.

Since the critical temperature at which magnesium diboride ($MgB_2$) becomes superconducting is higher than that of the metallic materials in the related art, magnesium diboride is expected to be put into practical use as a superconducting magnet by refrigerator cooling without using liquid helium. In that case, since refrigerator cooling without using liquid helium is required to operate at 10 K or more, it is not possible to apply the superconducting solder joint of the related art with a critical temperature of 10 K or less may. Therefore, it is necessary to establish a technique for joining $MgB_2$ wires to each other by a $MgB_2$ sintered body.

Overview

By providing a space for filling Mg in a portion not adjacent to the $MgB_2$ sintered body (before heat treatment, B powder-filled portion), it is possible to pressurize B powder which is a raw material of the $MgB_2$ sintered body to high density, and after the heat treatment, the $MgB_2$ sintered body is mechanically firmly supported by a container and a pressurizing member. Thereby, it is possible to realize a joint portion having excellent conducting properties and high reliability.

COMPARATIVE EXAMPLE

Figure 1A:
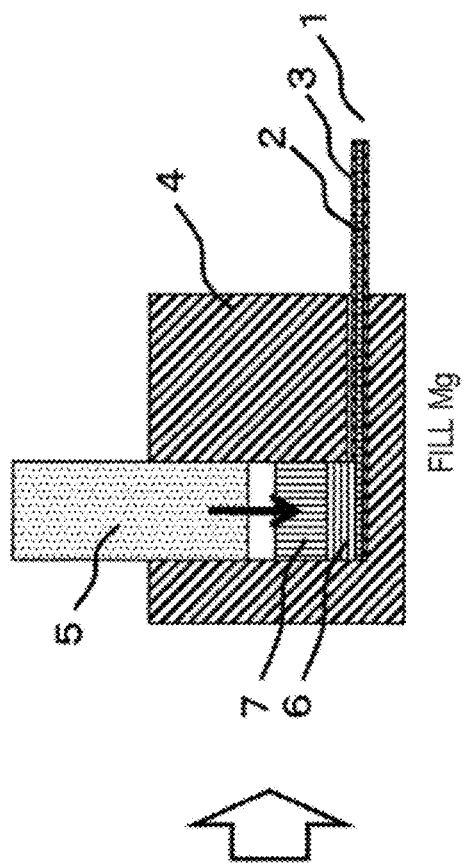
FIG. 1A-1C are joining structures and a process of a comparative example.
Figure 1B:
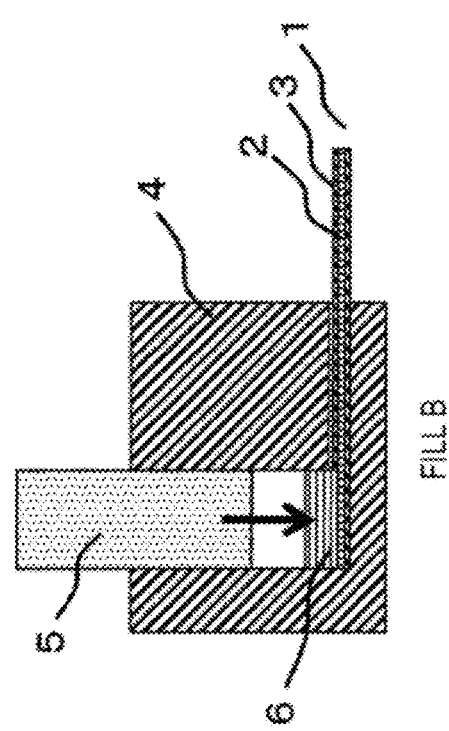
Figure 1C:
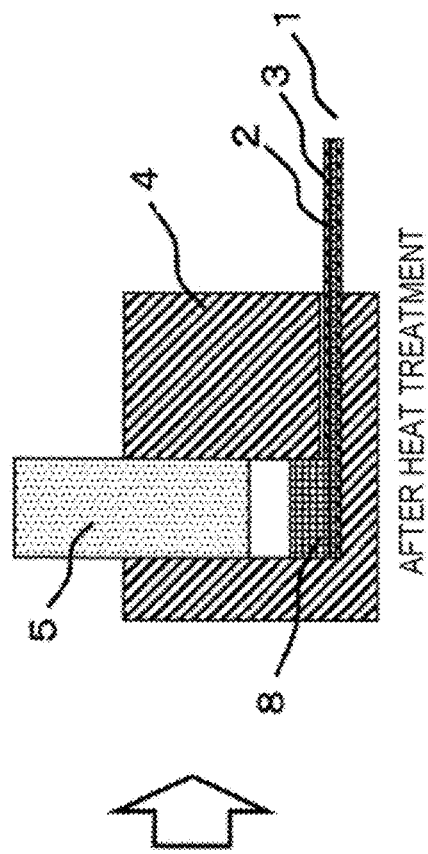

FIG. 1 shows an example of a joining structure and a process of a comparative example. As shown in FIG. 1A, a plurality of wires 1 are inserted into a container 4, B powder 6 is filled in an end portion thereof, and the B powder 6 is pressurized by a pressurizing member 5. The wire 1 is composed of a $MgB_2$ core 2 and a sheath member 3. Thereafter, as shown in FIG. 1B, Mg powder 7 is filled and the B powder 6 and the Mg powder 7 are pressurized by the pressurizing member 5. Thereafter, by heat treatment, a $MgB_2$ sintered body 8 is formed.

When the B powder 6 and the Mg powder 7 are filled in two layers as described above, the Mg powder 7 melts during the heat treatment and permeates and diffuses into the region of the B powder 6, whereby the filling portion of the B powder 6 expands by about 1.8 times the volume thereof, and the very dense $MgB_2$ sintered body 8 is formed.

There are the following two problems in the structure of FIG. 1. The first problem is that the B powder 6 may not be pressurized to high density as the B powder 6 is pressurized through the soft Mg powder 7 (high pressure is necessary to pressurize to the same density). The second problem is that the Mg powder 7 melts during heat treatment, creating a space between the pressurizing member 5 and the B powder 6. If a space is created, a void is formed even if volume expansion occurs due to the formation of the $MgB_2$ sintered body 8, and the effect of improving the adhesion between the $MgB_2$ core 2 and the $MgB_2$ sintered body 8 is reduced. Since a space exists adjacent to the $MgB_2$ sintered body 8 after the heat treatment, the mechanical support of the $MgB_2$ sintered body 8 is insufficient, and peeling from the $MgB_2$ core 2 is feared.

Superconducting Magnet

In the superconducting magnet having the joining structure of superconducting wires as described above, the reliability of the joint portion is high and stable operation without quenching is possible.

FIG. 2 shows a configuration example of the superconducting magnet. In the superconducting magnet shown in FIG. 2, a superconducting coil 22 and a persistent current switch 23 are placed inside a cryostat 26 and cooled by a refrigerator (not shown) via a support plate 25. When the superconducting coil 22 is excited, a current is supplied through a current lead 24 that connects a power source on the room temperature side (not shown) and the superconducting coil 22 on the low temperature side. Two superconducting joint portions 21 are provided between the superconducting coil 22 and the persistent current switch 23.

Example 1

Here, as a superconducting wire to be joined, a single core wire having one $MgB_2$ core in a metal sheath material will be described as an example, but the present invention is also applicable to a multi-core wire having many $MgB_2$ cores. In general, the sheathing material is made of a stabilizing material (Cu, Ni, or the like) for securing high electrical and thermal stability and a barrier material (Fe, Nb, or the like) for preventing reaction with the stabilizing material during heat treatment for converting Mg and B into $MgB_2$. In addition, the superconducting wire to be joined is not limited to $MgB_2$, but the present invention is also applicable to NbTi and $Nb_3Sn$ being used in superconducting magnets of the related art. Further, the number of superconducting wires to be joined is not limited to two, and three or more superconducting wires may be used.

Figure 3A:
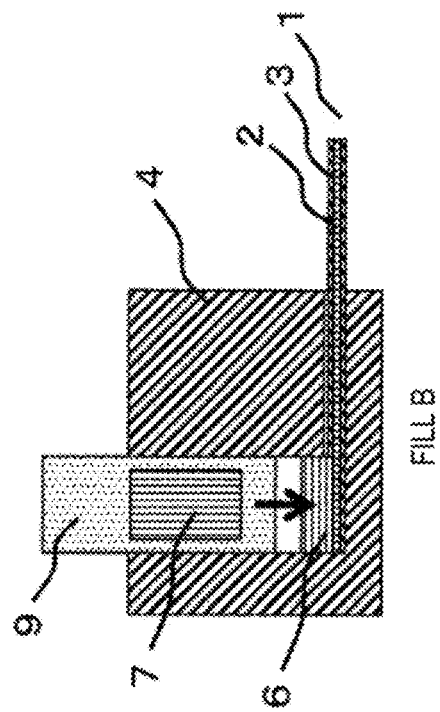
FIG. 3A-3C are joining structures and a process of Example 1.
Figure 3B:
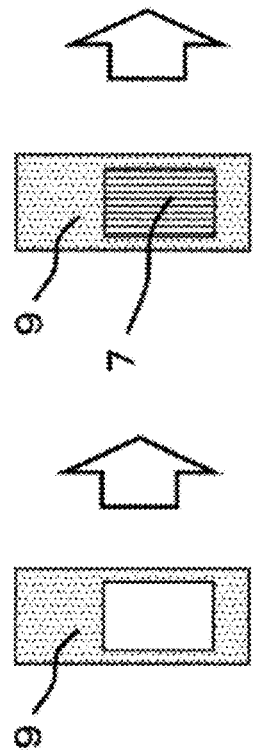
Figure 3C:
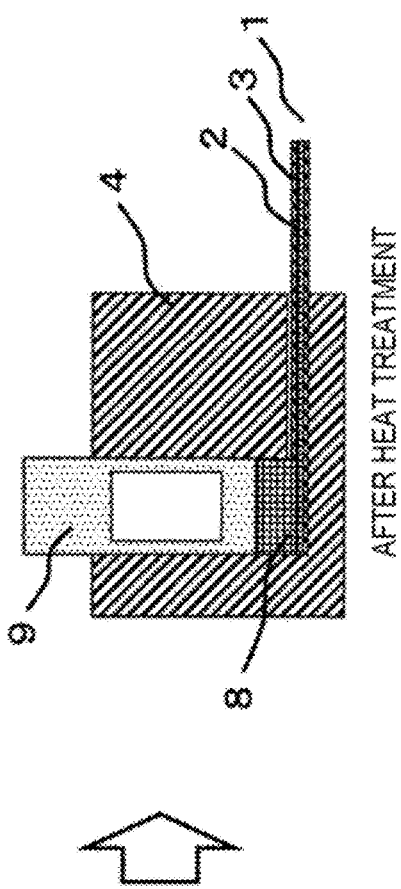

FIG. 3 shows a joining structure and a joining process in the present example. The $MgB_2$ core 3 of the wire 1 to be joined may be in the state of Mg+B (unbaked) or in the state of $MgB_2$ (already baked). In a case where the sheathing material 2 of the wire 1 contains a stabilizing material such as Cu which easily reacts with Mg, the stabilizing material is removed by mechanical polishing or chemical polishing. Further, a part of the sheath material is mechanically polished to expose the core at the end portion of the wire to be joined. In the present example, the Mg powder 7 is filled in the pressurizing member 9.

FIG. 4 shows a detailed structure (front view, side view, and bottom view) of the pressurizing member 9. A hole 10 is formed in a columnar member from the side surface, and Mg is filled therein. Considering the evaporation during the heat treatment, it is desirable that Mg is filled in excess with respect to B (at a molar ratio of 0.5 or more with respect to B). Considering the volume, it is desirable that Mg is filled with a volume larger than 60% of the B powder-filled portion (the portion to be a $MgB_2$ sintered body). Mg to be filled may be powder, but it is desirable that a lump (bulk) of Mg is easier to handle. The material of the pressurizing member 9 may be any material as long as the material has a higher melting point than Mg and is difficult to react with Mg and B. Nb, Fe, Ta, and alloys thereof may be mentioned, but are not limited thereto, and may not be metal.

As may be seen from the front view of FIG. 4, a space 10 for filling Mg is located inside the pressurizing member 9, but is not surrounded by the pressurizing member 9 and is exposed to the outside. Therefore, when filling the space 10 of the pressurizing member 9 for filling Mg with Mg, Mg is exposed to the outside. Therefore, after Mg is melted by heat, Mg may flow out of the pressurizing member 9.

As shown in FIG. 3, a plurality of wires 1 are inserted into the container 4, and the B powder 6 is filled in the end portion thereof. Thereafter, the pressurizing member 9 filled with the Mg powder 7 is inserted and the B powder 6 is pressurized. At this time, since the Mg powder 7 has already been filled, in this state, the pressurizing member 9 may be fixed with the container 4 with a heat resistant adhesive or the like. That is, the B powder 6 may be mechanically firmly fixed in such a state of being directly pressurized to high density and is maintained also during the heat treatment.

Basically, as the material to be filled into the $MgB_2$ sintered body 8, the B powder 6 is filled in the container 4, and the Mg powder 7 is filled in the pressurizing member 9, but it is also conceivable to fill the container 4 and the pressurizing member 9 in the following manner. For the purpose of improving the conducting properties in a high magnetic field, a compound containing carbon as typified by SiC is added to the B powder 6 to be filled into the container 4, and for the purpose of controlling the density of the $MgB_2$ sintered body 8 to be formed, a small amount of Mg powder 7 or $MgB_2$ powder is added. It is also conceivable to fill the raw material to be filled into the pressurizing member 9 with Mg alloy having a lower melting point than Mg for the purpose of lowering the heat treatment temperature.

After completion of filling, heat treatment for conversion into $MgB_2$ is performed. During the heat treatment, the Mg powder in the pressurizing member 9 melts and flows out to the B powder-filled portion, where the $MgB_2$ sintered body 8 is formed. In order to allow the molten Mg to flow and adhere to the B powder-filled portion, a gap is previously provided between the pressurizing member 9 and the container 4.

Mg flows towards the B powder-filled portion, but in the present example, since a larger amount of Mg is contained, not all of Mg is used to form a $MgB_2$ sintered body, and a small amount of Mg remains as an unreacted material. The small amount of Mg is located in the pores formed between the space formed in the pressurizing member and the sintered body after the heat treatment.

A groove 11 shown in FIG. 4 is intended to secure a flow path through which Mg flows out. Even without the groove 11, Mg flows out from the gap between the pressurizing member 9 and the container 4, but in order to complete the reaction in a shorter time, the groove 11 is effective. The size and shape of the groove 11 may be any as long as the groove 11 does not cause a problem when the B powder is pressurized. The heat treatment is performed at 600° C. to 900° C. in an inert gas such as argon and nitrogen by using an electric furnace or the like. In a case where the wire core 3 is not baked, the wire core 3 is converted into $MgB_2$ at the same time. In the case where the wire core has already baked, only the end portion may be subject to heat treatment locally. After the heat treatment, the groove 11 becomes pores connecting the space 10 and the sintered body 8.

As shown in FIG. 3, the $MgB_2$ sintered body in the joint portion after the heat treatment is firmly supported by the container 4 and the pressurizing member 9, and it is possible to realize a joint portion having excellent conducting properties and high reliability.

Before Mg flows and adheres to the B powder-filled portion, the B powder is compressed to the container 4 to high density by the pressurizing member 9. When a $MgB_2$ sintered body is formed by reacting Mg powder compressed to high density with Mg in heat treatment, the $MgB_2$ sintered body pushes up the pressurizing member 9 somewhat in the inlet direction of the container.

Example 2

FIG. 5 shows a joining structure and a joining process in the present example. The basic concept is the same as in Example 1. In the present example, a space for filling Mg is provided in a container 12. As shown in FIG. 5, Mg is filled in a place not adjacent to the B powder-filled portion. The B powder-filled portion and Mg-filled portion are connected by small holes (pores) for Mg to flow out. By adopting such a structure, it is possible to obtain the same effect as in Example 1. However, as compared with Example 1, the structure of the container is complicated and it is difficult to process the structure, the container becomes unnecessarily large, and therefore the structure of Example 1 is more desirable.

At this time, there are a plurality of pressurizing members 5, one pressurizing member 5 is located adjacent to the sintered body 8, and a space exists between the other pressurizing member 5 and the sintered body 8. The container 12 has pores 13 connecting the space and the sintered body 8.

As in Example 1, Mg flows towards the B powder-filled portion, but in the present example, since a larger amount of Mg is contained, not all of Mg is used to form a $MgMgB_2$ sintered body, and a small amount of Mg remains as an unreacted material. The small amount of Mg is located in the pores formed between the space formed in the container and the sintered body after the heat treatment.

REFERENCE SIGNS LIST

1: wire
2: $MgB_2$ core
3: sheath material
4: container
5: pressurizing member
6: B powder
7: Mg powder
8: $MgB_2$ sintered body
9: pressurizing member
10: space
11: groove
12: container
13: pore
21: superconducting joint portion
22: superconducting coil
23: persistent current switch
24: current lead
25: support board
26: cryostat

The invention claimed is:

1. A joint portion of superconducting wires, comprising:
   a container;
   a pressurizing member;
   a plurality of superconducting wires; and
   a sintered body that integrates the plurality of superconducting wires; wherein
   the plurality of superconducting wires and the sintered body include $MgB_2$,
   the pressurizing member is located adjacent to the sintered body,
   a space exists inside the pressurizing member, and
   the pressurizing member includes pores connecting the space and the sintered body.

2. The joint portion of superconducting wires according to claim 1, wherein magnesium exists in the pores.

3. The joint portion of superconducting wires according to claim 1, wherein
   the volume of the space is equal to or larger than 60% of the volume of the sintered body.

4. A method of joining superconducting wises comprising:
   an inserting step of inserting a plurality of superconducting wires into a container;
   a magnesium filling step of filling magnesium into the pressurizing member or into the container;
   a boron filling step of filling the container with boron;
   a pressurizing step of pressurizing the magnesium and the boron by a pressurizing member; and
   a heat treatment step for forming a $MgB_2$ sintered body by heat treatment,
   wherein, before the pressurizing step, the portion filled with magnesium and the portion filled with boron are not adjacent to each other.

5. The method of joining superconducting wires, according to claim 4, wherein
   in the magnesium filling step, the magnesium is filled in the pressurizing member.

6. The method of joining superconducting wires, according to claim 5, wherein
   in the heat treatment step, magnesium melts and flows out to the portion filled with boron.

7. The method of joining superconducting wires, according to claim 6, wherein
   there is a flow path through which the magnesium flows out from the portion filled with magnesium to the portion filled with boron.

8. The method of joining superconducting wires, according to claim 4, wherein
   in the magnesium filling step, the magnesium is filled in the container.

9. The method of joining superconducting wires, according to claim 4, wherein the amount of magnesium to be filled in the magnesium filling step is larger than 0.5 in terms of molar ratio with respect to the amount of boron to be filled in the boron filling step.

* * * * *